United States Patent
Lui et al.

(10) Patent No.: US 10,062,685 B2
(45) Date of Patent: *Aug. 28, 2018

(54) VARIABLE SNUBBER FOR MOSFET APPLICATION

(71) Applicant: Alpha and Omega Semiconductor Incorporated, Sunnyvale, CA (US)

(72) Inventors: Sik Lui, Sunnyvale, CA (US); Ji Pan, San Jose, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/623,210

(22) Filed: Jun. 14, 2017

(65) Prior Publication Data

US 2017/0287903 A1    Oct. 5, 2017

Related U.S. Application Data

(63) Continuation of application No. 14/987,610, filed on Jan. 4, 2016, now Pat. No. 9,685,435, which is a
(Continued)

(51) Int. Cl.
*H02M 1/34* (2007.01)
*H01L 27/06* (2006.01)
(Continued)

(52) U.S. Cl.
CPC .......... *H01L 27/0629* (2013.01); *H01L 28/20* (2013.01); *H01L 29/407* (2013.01);
(Continued)

(58) Field of Classification Search
CPC .............. H02M 2001/348; H02M 1/34; H01L 27/0629; H01L 28/20; H01L 29/407;
(Continued)

(56) References Cited

U.S. PATENT DOCUMENTS 3,897,763 A  8/1975  Kenyon et al.
4,646,114 A  2/1987  Vinn et al.
(Continued)

FOREIGN PATENT DOCUMENTS

CN    1551240 A    12/2004

OTHER PUBLICATIONS

Chinese Office Action for CN Application No. 201410054781.2, dated Jul. 4, 2016.
(Continued)

*Primary Examiner* — Emily P Pham
(74) *Attorney, Agent, or Firm* — JDI Patent; Joshua Isenberg; Robert Pullman

(57) ABSTRACT

Aspects of the present disclosure describe MOSFET devices that have snubber circuits. The snubber circuits comprise one or more resistors with a dynamically controllable resistance that is controlled by changes to a gate and/or drain potentials of the one or more MOSFET structures during switching events.

20 Claims, 5 Drawing Sheets

Related U.S. Application Data continuation of application No. 13/943,156, filed on Jul. 16, 2013, now Pat. No. 9,230,157.

(60) Provisional application No. 61/776,276, filed on Mar. 11, 2013.

(51) Int. Cl.

| | | |
|---|---|---|
| *H01L 29/8605* | (2006.01) | |
| *H01L 29/66* | (2006.01) | |
| *H01L 29/40* | (2006.01) | |
| *H01L 49/02* | (2006.01) | |
| *H01L 29/94* | (2006.01) | |
| *H01L 29/78* | (2006.01) | |

(52) U.S. Cl.
CPC .. *H01L 29/66181* (2013.01); *H01L 29/66666* (2013.01); *H01L 29/7803* (2013.01); *H01L 29/7813* (2013.01); *H01L 29/8605* (2013.01); *H02M 1/34* (2013.01); *H01L 29/7811* (2013.01); *H01L 29/94* (2013.01); *H02M 2001/348* (2013.01)

(58) Field of Classification Search
CPC ......... H01L 29/66181; H01L 29/66666; H01L 29/7803; H01L 29/7813; H01L 29/8605; H01L 29/7811; H01L 29/94
See application file for complete search history.

(56) References Cited

U.S. PATENT DOCUMENTS

| | | | |
|---|---|---|---|
| 5,644,270 A | 7/1997 | Moyer et al. | |
| 6,232,654 B1 | 5/2001 | Nagase | |
| 6,466,069 B1 | 10/2002 | Rozenblit et al. | |
| 6,614,281 B1* | 9/2003 | Baudelot | H03K 17/0828 327/321 |
| 6,645,815 B2 | 11/2003 | Hshieh et al. | |
| 6,977,203 B2 | 12/2005 | Hshieh et al. | |
| 7,336,459 B2 | 2/2008 | Chen | |
| 7,768,064 B2 | 8/2010 | Sapp et al. | |
| 8,138,605 B2 | 3/2012 | Chang et al. | |
| 8,193,848 B2 | 6/2012 | Zhang et al. | |
| 8,324,683 B2 | 12/2012 | Lui et al. | |
| 8,394,702 B2 | 3/2013 | Tai et al. | |
| 8,502,302 B2 | 8/2013 | Su et al. | |
| 8,507,978 B2 | 8/2013 | Bhalla et al. | |
| 8,580,676 B2 | 11/2013 | Chang et al. | |
| 8,748,268 B1 | 6/2014 | Pan et al. | |
| 8,785,270 B2 | 7/2014 | Su et al. | |
| 8,824,177 B2* | 9/2014 | Godo | H01L 23/49575 363/56.12 |
| 8,828,857 B2 | 9/2014 | Lui et al. | |
| 8,907,416 B2 | 12/2014 | Tai et al. | |
| 8,969,950 B2 | 3/2015 | Pan | |
| 8,980,716 B2 | 3/2015 | Lui et al. | |
| 9,006,053 B2 | 4/2015 | Pan et al. | |
| 9,214,545 B2 | 12/2015 | Tai et al. | |
| 9,230,957 B2 | 1/2016 | Lui et al. | |
| 9,252,264 B2 | 2/2016 | Bobde et al. | |
| 9,502,554 B2 | 11/2016 | Bobde et al. | |
| 9,564,516 B2 | 2/2017 | Pan | |
| 9,685,435 B2* | 6/2017 | Lui | H01L 27/0629 |
| 2004/0175889 A1 | 9/2004 | Huang et al. | |
| 2006/0158127 A1 | 7/2006 | Xu | |
| 2007/0170910 A1 | 7/2007 | Chang et al. | |
| 2007/0285171 A1 | 12/2007 | Karthaus et al. | |
| 2008/0157730 A1 | 7/2008 | Kim et al. | |
| 2009/0253239 A1* | 10/2009 | Coolbaugh | H01L 27/0658 438/330 |
| 2010/0327378 A1* | 12/2010 | Tseng | H01L 21/28088 257/411 |
| 2011/0233667 A1 | 9/2011 | Tai et al. | |
| 2012/0056258 A1 | 3/2012 | Chen | |
| 2013/0009225 A1 | 1/2013 | Kocon | |
| 2013/0049846 A1 | 2/2013 | Jang et al. | |
| 2013/0128923 A1 | 5/2013 | Sawada | |
| 2013/0187543 A1 | 7/2013 | Chang et al. | |
| 2014/0048846 A1 | 2/2014 | Lui et al. | |
| 2014/0179074 A1 | 6/2014 | Pan et al. | |
| 2014/0235024 A1 | 8/2014 | Pan et al. | |
| 2015/0097232 A1 | 4/2015 | Tai et al. | |
| 2015/0137227 A1 | 5/2015 | Bobde et al. | |
| 2015/0171192 A1 | 6/2015 | Pan | |
| 2015/0171201 A1 | 6/2015 | Lui et al. | |
| 2016/0141411 A1 | 5/2016 | Bobde et al. | |

OTHER PUBLICATIONS

Non-Final Office Action for U.S. Appl. No. 13/943,156, dated Dec. 18, 2014.
Non-Final Office Action for U.S. Appl. No. 13/943,156, dated May 5, 2015.
Severns, Rudy, and E. M. I. Reduce. "Design of snubbers for power circuits." International Rectifier Corporation (2006).
U.S. Appl. No. 61/776,276 to Sik Lui, entitled "Variable Snubber for MOSFET Application", filed Mar. 11, 2013.

* cited by examiner

VARIABLE SNUBBER FOR MOSFET APPLICATION

CLAIM OF PRIORITY

This application is a continuation of commonly-assigned U.S. patent application Ser. No. 14/987,610, filed Jan. 4, 2016, the entire contents of which are incorporated herein by reference. U.S. patent application Ser. No. 14/987,610 is a continuation of U.S. patent application Ser. No. 13/943,156, filed Jul. 16, 2013, the entire contents of which are incorporated herein by reference. U.S. patent application Ser. No. 13/943,156 claims the priority benefit of U.S. Provisional Patent Application No. 62/776,276, filed Mar. 11, 2013, the entire contents of which are incorporated herein by reference.

FIELD OF THE DISCLOSURE

This disclosure generally relates to transistors and more particularly snubber circuits for use in metal oxide silicon field effect transistors (MOSFET) transistor applications.

BACKGROUND OF THE DISCLOSURE

One of the benefits of a using a MOSFET device is the high rate at which the device can be switched from an "on" state to an "off" state. Faster switching allows for a more efficient device, but it also creates undesirable waveforms that may negatively affect the device. Specifically, a MOSFET device may be under high stress because the maximum voltage and maximum current must be supported simultaneously. This may cause the device to exceed the safe operating area (SOA) and result in device failure. Therefore snubbers, such as a resistor-capacitor (RC) snubber, or a resistor-capacitor-diode (RCD) snubber, are often used to improve the switching waveform in order to reduce the peak voltage and current. A typical RC snubber circuit 100 integrated with a MOSFET device 110 is shown in FIG. 1A. In the snubber circuit 100 a snubber capacitor 118 and snubber resistor 119 are connected in series with each other and in parallel with the MOSFET device 110. In the MOSFET device 110 the capacitor 117 is the source to drain capacitance $C_{DS}$ inherent in the device. Additionally, the node 114 is maintained at gate potential, node 115 is maintained at drain potential, and node 116 is maintained at source potential.

A cross sectional view of a MOSFET device 110 that incorporates a snubber circuit is shown in FIG. 1B. In the figure the MOSFET device is a shielded gate trench (SGT) MOSFET device. It should be noted that the electrical connection between the source 112 and the shield electrode 113 (in addition to the snubber resistor 119) are not visible in this cross sectional view, and therefore are represented with schematic connections. A typical SGT MOSFET device has a trench lined with an insulative material 126. The insulative material 126 also electrically isolates the shield electrode 113 from the gate electrode 124. A source contact 146 may connect the source material 112 to the source region 128 that is formed in the body layer 127. A drain contact 129 may also be formed on a bottom surface of the device 110.

However, despite the benefits of having a snubber circuit integrated with a MOSFET device, the presence of the snubber resistor 119 may actually decrease the breakdown voltage $V_{BD}$ of the device. For example, during the turn-off of an SGT MOSFET device 110, the presence of a snubber resistor 119 causes the shield voltage to increase above the source voltage because of displacement drain current going through shield resistor. The difference in the potentials between the shield electrode 113 and the source 112 may cause a reduction in $V_{BD}$. The device may breakdown during switching and hence reduces the reliability of the device.

Therefore, there is a need in the art to provide a snubber circuit that has a higher resistance during the beginning of switching to reduce displacement current and thereafter has a low resistance near the middle of switching in order to get have an optimized waveform without sacrificing $V_{BD}$.

It is within this context that aspects of the present disclosure arise.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. In the following discussion, an N type device is described for purposes of illustration. P type devices may be fabricated using a similar process but with opposite conductivity types.

Figure 1A:
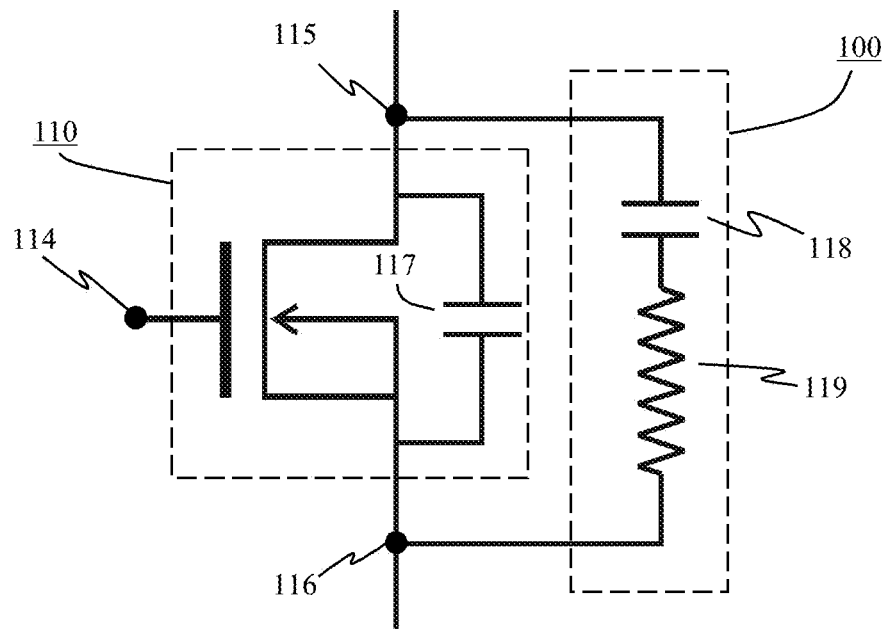
FIG. 1A is schematic diagram of typical snubber circuit incorporated with a MOSFET device.
Figure 1B:
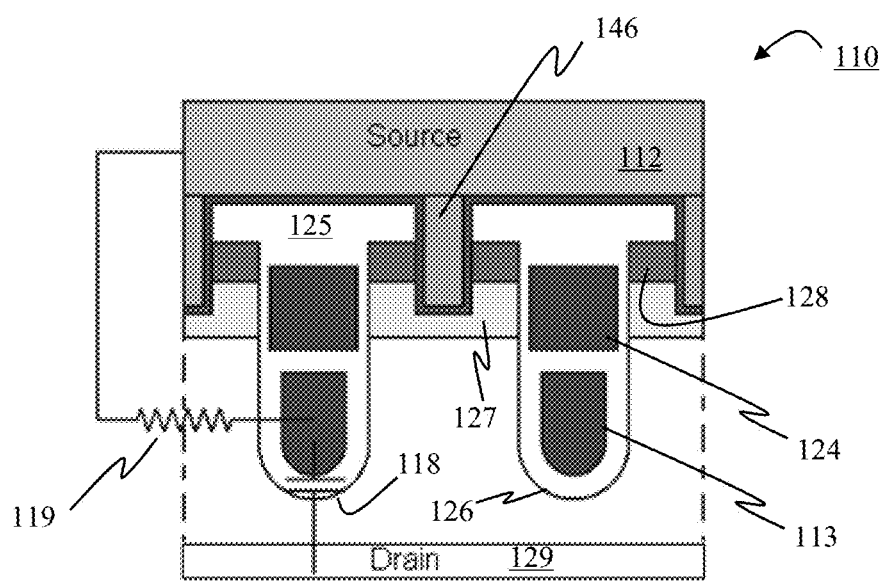
FIG. 1B is a cross sectional view of an SGT MOSFET device that has a snubber circuit incorporated into the device.
Figure 2A:
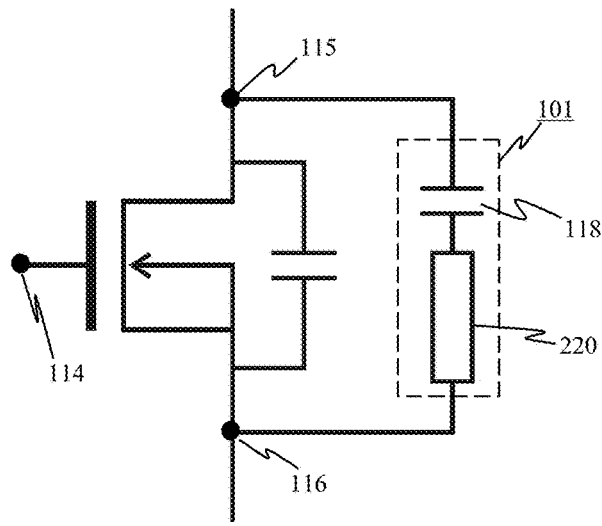
FIG. 2A is a circuit diagram depicting a generic version of a snubber circuit with a dynamically variable resistor according to various aspects of the present disclosure.

Aspects of the present disclosure describe snubber circuits 101 for use in MOSFET applications where the resistor 119 is replaced with a dynamically variable resistor 220. As shown in FIG. 2A the basic structure of the snubber 101 is similar to snubber circuit 100 except for the replacement of a passive resistor 119 that has substantially constant resistivity with a dynamically variable resistor 220 that is capable of varying its resistivity during switching events of the MOSFET device. As used herein a "switching event" may refer to the switching from an "on" state to an "off" state, or from an "off" state to an "on" state. The use of a dynamically variable resistor 220 in a snubber circuit 101 has several benefits. First, the variable resistance allows for additional freedom to control the voltage and current overage and dynamic breakdown during the switching event. This is possible because the variable resistance allows for the switching waveform to be altered without degrading the device's reliability. Specifically, an optimized combination of dynamically variable resistors 220 according to various aspects of the present disclosure may be incorporated into a MOSFET device in order to have a resistance that is high during the beginning of switching in order to reduce displacement current but switches to a low resistance in the middle and the end of switching in order to provide a good waveform without breaking down during the switching event.

Figure 2B:
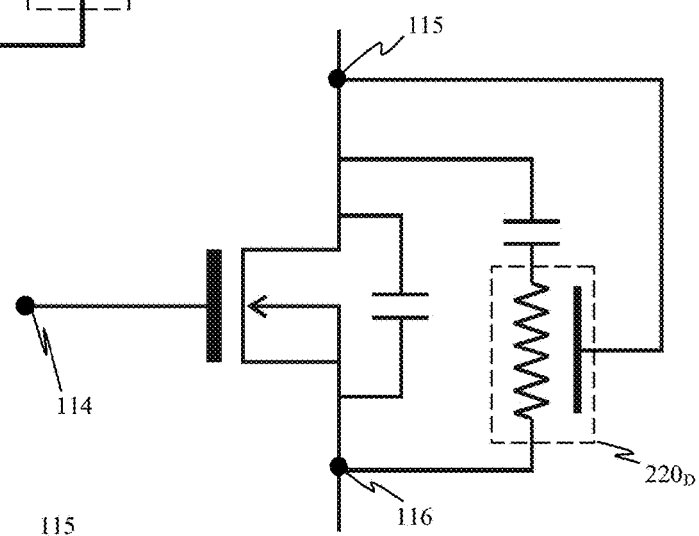
FIG. 2B is a circuit diagram of a drain controlled dynamically variable resistor according to various aspects of the present disclosure.
Figure 2C:
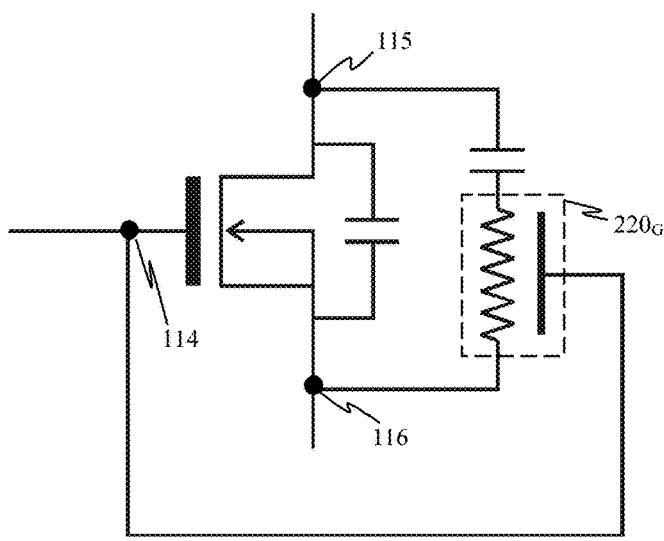
FIG. 2C is a circuit diagram of a gate controlled dynamically variable resistor according to various aspects of the present disclosure.

In FIG. 2A the dynamically variable resistor 220 is simply shown as a rectangular box in order to indicate that there are multiple types devices that may be used. According to aspects of the present disclosure, the dynamically variable resistor 220 may be a three terminal resistor. By way of example, and not by way of limitation, the three terminal resistor may be a depletion MOSFET, an enhancement MOSFET that is connected in parallel with a passive resistor 119, a JFET, a thin film transistor (TFT) MOSFET, or any other similar three terminal structures known in the art. The dynamic variable control of the resistor is provided by the third terminal. The third terminal functions substantially similar to a gate electrode in FET devices because it regulates the flow of current between the first and second terminals of the resistor. Therefore, as used herein the dynamically variable resistor's third terminal may also be referred to as the "resistor gate". However, it should be noted that the resistor gate is not necessarily maintained at the gate potential 114 of the MOSFET device. According to aspects of the present disclosure the resistor gate may be maintained at either the drain potential 115 or the gate potential 114. In FIG. 2B, a circuit diagram is provided that illustrates an aspect of the present disclosure where the resistor gate is connected to the drain potential 115 of the MOSFET device. As used herein, a dynamically variable resistor with the resistor gate maintained at drain potential 115 may also be referred to as a "drain controlled resistor" $220_D$. In FIG. 2C, a circuit diagram is provided that illustrates an aspect of the present disclosure where the resistor gate is connected to the gate potential 114 of the MOSFET device. As used herein, a dynamically variable resistor with the resistor gate maintained at gate potential 114 may also be referred to as a "gate controlled resistor" $220_G$.

Figure 3A:
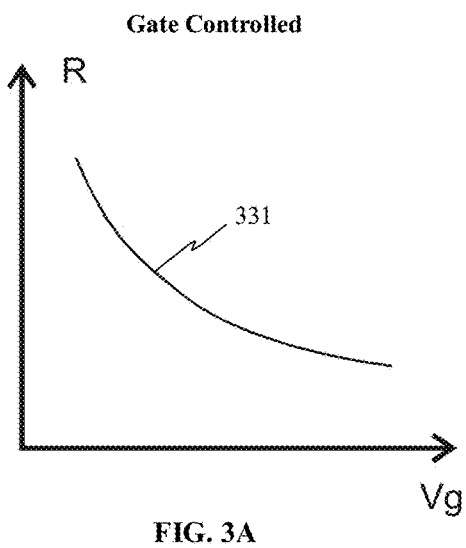
FIGS. 3A-3D are graphs that depict a generalized relationship between the resistance of dynamically variable resistors and the gate voltage of the MOSFET device.
Figure 3B:
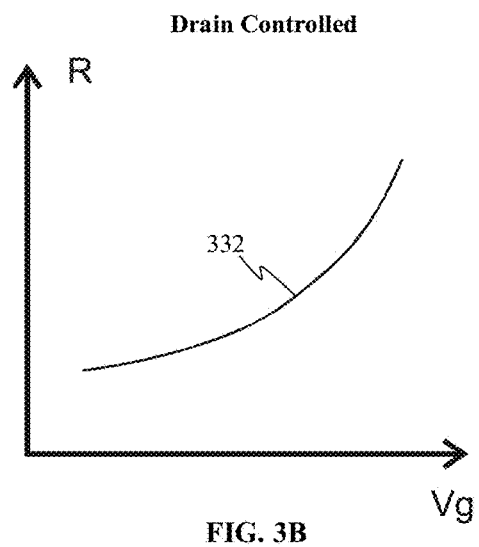

The change in resistivity of a dynamically variable resistor 220 with respect to the change in the gate voltage $V_g$ of the active MOSFET device is dependent on whether the resistor 220 is gate controlled or drain controlled. The line 331 in FIG. 3A shows the general relationship between the resistivity with respect to $V_g$ for a gate controlled resistor $220_G$. As may be seen, when $V_g$ is low, the resistor's resistance is relatively high. Then, as the gate potential begins to increase, the resistivity of the resistor $220_G$ deceases. The line 332 in FIG. 3B shows the general relationship between the resistivity with respect to $V_g$ of the active MOSFET device for a drain controlled resistor $220_D$. As may be seen, when the gate potential is low, the resistivity of the resistor $220_D$ is low. Then, as the gate potential begins to increase the resistivity of the resistor increases as well.

Figure 2D:
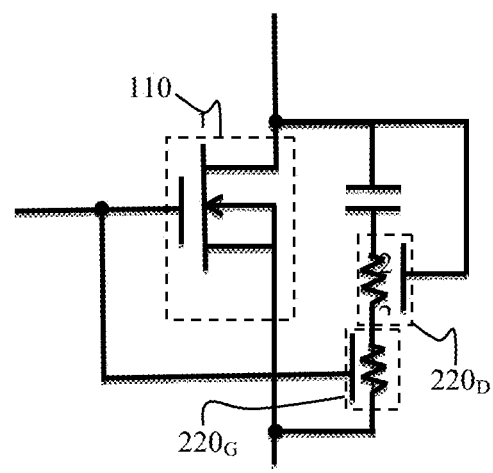
FIG. 2D is a circuit diagram depicting a generic version of a snubber circuit with a drain controlled variable resistor and a gate controlled variable resistor in series according to various aspects of the present disclosure.
Figure 2E:
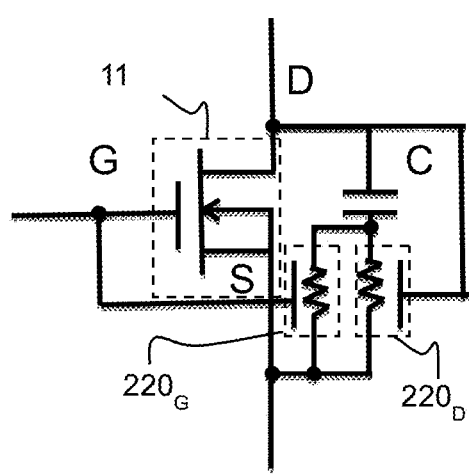
FIG. 2E is a circuit diagram depicting a generic version of a snubber circuit with a drain controlled variable resistor and a gate controlled variable resistor in parallel according to various aspects of the present disclosure.
Figure 3C:
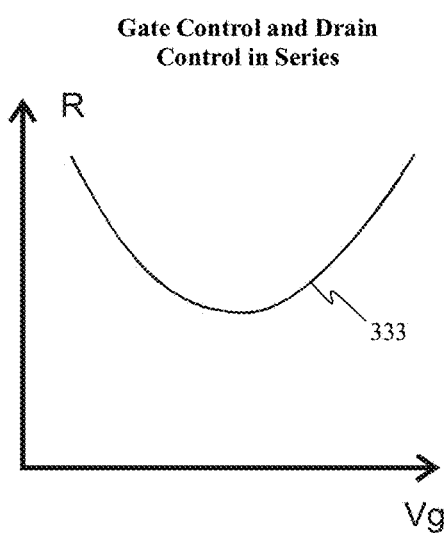
Figure 3D:
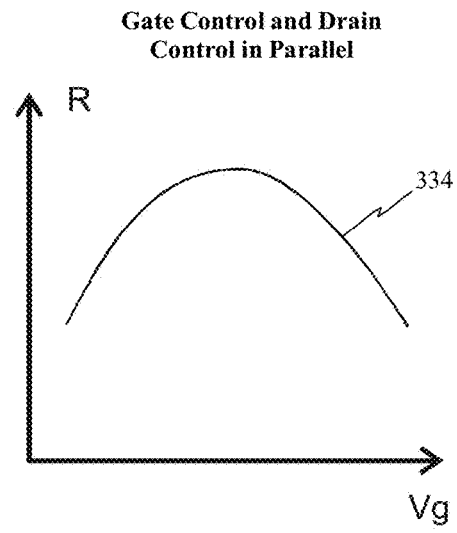

According to additional aspects of the present disclosure, more complex relationships between resistivity and $V_g$ may be obtained by using two or more resistors 220 in various electrical configurations. For example, a gate controlled resistor $220_G$ may be connected in series with a drain controlled resistor $220_D$, e.g., as depicted in FIG. 2D. The general relationship between the combined resistance of the two resistors in series with respect to the gate voltage of the MOSFET device is shown by line 333 in FIG. 3C. As may be seen, the resistance is initially high when $V_g$ is low, it decreases to a minimum resistance, and ultimately begins to increase at higher values of $V_g$. Alternatively, the gate controlled and drain controlled resistors $220_G$, $220_D$ may be connected in parallel, e.g., as depicted in FIG. 2E. The general relationship between the combined resistance with respect to $V_g$ is shown by line 334 in FIG. 3D. The behavior of the combined resistance is substantially opposite to that of the combined resistance when the two resistor types are connected in series. As such the resistance begins low at low values of $V_g$, increases until it reaches a peak resistance, and ultimately decreases at higher values of $V_g$.

FIGS. 3A-3D depict four different connection configurations that may be used to dynamically control the resistance of the snubber circuit 101. Additionally, a traditional constant resistance resistor 119 may be incorporated with any of the other four resistor configurations. Therefore, when customizing the wave form with dynamic variable resistors, there are at least five general configurations and five corresponding general resistance-$V_g$ relationships that may be utilized in order to optimize the desired wave form: 1) drain controlled resistor; 2) gate controlled resistor; 3) constant resistance resistor; 4) drain controlled resistor in series with gate controlled resistor; and 5) drain controlled resistor in parallel with gate controlled resistor. In order to build a desired snubber circuit 101, any number of each resistor type and/or any number of electrical circuit configuration combinations may be used. It is noted that aspects of the present disclosure include implementations involving series or parallel or mixed series/parallel combinations of two or more of these general configurations.

Figure 4A:
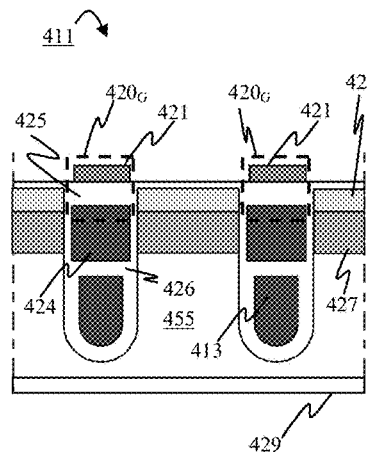
FIGS. 4A-4B are cross sectional views of a MOSFET device that has gate controlled dynamically variable resistors incorporated into the device.
Figure 4B:
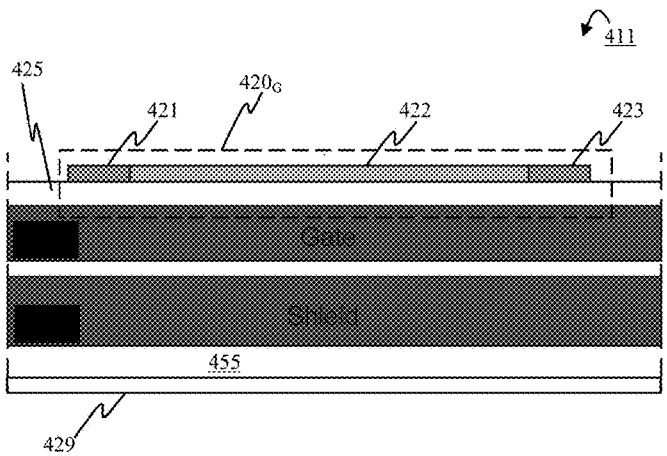
Figure 4C:
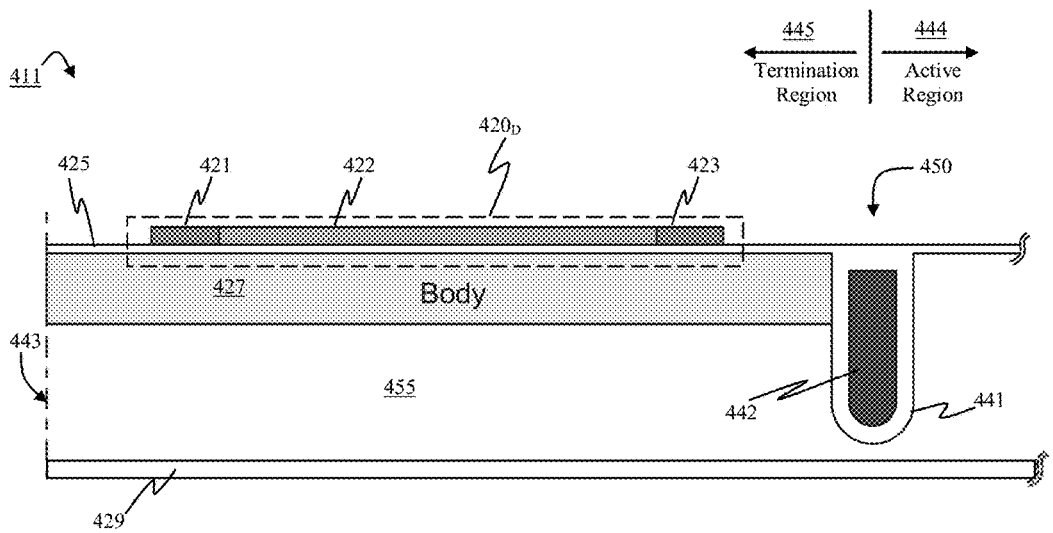
FIG. 4C is a cross sectional view of a MOSFET device that has a drain controlled dynamically variable resistor incorporated into the device.

FIGS. 4A-4C are cross sectional views of a MOSFET device 411 that incorporates dynamic variable resistors 420 according to various aspects of the present disclosure. For simplicity, the cross sectional views depict a thin film transistor (TFT) MOSFET, but it should be clear to those skilled in the art that alternative thee terminal resistor devices, such as, but not limited to, a depletion MOSFET, an enhancement MOSFET in parallel with a fixed resistor, or a JFET, utilize substantially the same operating principles. Additionally, the active MOSFET structures are shown as shielded-gate trench MOSFETs, though any MOSFET device may benefit from the use of dynamic variable resistors according to aspects of the present disclosure. By way of example, an SGT MOSFET structure may be formed on a semiconductor substrate 455, such as silicon wafer. A drain contact 429 that is maintained at drain potential 115 may be formed on a bottom surface of the substrate. The substrate 455 may be separated into an active region 444 and a termination region 445. The active device structures are located in the active region 444. The active device structures may comprise typical layers and formations, such as a body layer 427, a source layer 428, and a trench lined with an insulative material 426, such as an oxide material. The trench may have multiple conductive electrodes electrically isolated from each other by the insulative material 426, such as a shield electrode 413, and a gate electrode 424 that is maintained at a gate potential 114.

FIG. 4A is a cross sectional view of a gate controlled dynamic variable resistor $420_G$. The resistor $420_G$ is formed above the gate electrode 424 formed in the trench. An oxide layer 425 separates the resistor from the gate electrode 424. In FIG. 4B, an active device is shown along a plane running parallel to the length of the device trenches. From this view, the source terminal 421, the body 422 and the drain terminal 423 of the resistor $420_G$ may be seen. The source, body, and drain may be made of a semiconductor material. By way of example, they may be made from polysilicon. The source terminal 421 and the drain terminal 423 of the resistor may be heavily doped. By way of example, and as used throughout the rest of the description, the source and drain may be heavily $n^+$ doped. By way of example, the doping concentration at each end of the resistor may be approximately $5\times10^{19}/cm^3$ (requirement for Ohmic contact). The body region 422 of the resistor may be a lightly doped $n^-$ region. By way of example, the doping concentration of the area between the end regions may be approximately $1\times10^{15}/cm^3$. The doping concentration of the body determines the resistor value when the gate voltage is at zero. Alternatively, the middle region may be p-doped when used in aspects of the present disclosure that utilize an enhancement MOSFET for the resistor.

The third terminal of the gate controlled resistor $420_G$ is the gate electrode 424 formed in the trench. As such, the resistor gate needed for the resistor $420_G$ is already supplied by the active MOSFET device, and no additional processing (other than forming the source, body, and drain above the device trench) is needed to provide a third terminal connected to the gate potential 114.

FIG. 4C is a cross sectional view of a drain controlled dynamic variable resistor $420_D$ according to an aspect of the present disclosure. A channel stop trench 450 is used to divide the substrate into the active region 444 and a termination region 445. From the perspective shown in FIG. 4C the active region 444 is to the right of the channel stop, and the termination region 445 is to the left of the channel stop. The channel stop trench 450 may be a trench lined with an insulative material 441, such as an oxide, and filled with a conductive material 442, such as polysilicon. While a channel stop trench is shown in FIG. 4C, it should be noted that any sort of termination structure used to isolate an active region 444 from the termination region 445 may be used in accordance with aspects of the present disclosure.

The source and drain terminals 421, 423 and the body 422 of the drain controlled resistor $420_D$ are substantially similar to that of the gate controlled resistor $420_G$ described above. However, instead of being located in the active region 444 and above a gate electrode 424, the drain controlled resistor $420_D$ is located in the termination region 445 and separated from the body layer 427 by an oxide layer 425. The far left edge of the substrate 455 is a scribe line 443. The scribe line 443 is the location where individual device dies are separated. The scribe line 443 creates a short circuit to the drain contact 429. As such, the body region 427 shown in the termination region is held at drain potential 115. Since the body region 427 is at drain potential 115, it may be used as the resistor gate for a drain controlled resistor $420_D$. Therefore, there is no additional need to make a separate drain terminal contact in the fabrication of a drain controlled resistor, when the drain controlled resistor $420_D$ is formed above the body layer 427 in the termination region 445.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A transistor device, comprising:
   one or more gated structures formed in a semiconductor substrate, wherein the one or more gated structures comprise one or more field effect transistor structures each having a gate electrode;
   a snubber circuit connected in parallel with the one or more gated structures, wherein the snubber circuit includes one or more three-terminal resistors with a dynamically controllable resistance controlled by changes to a gate potential of the one or more gated structures during a switching event.

2. The device of claim 1, wherein the one or more three-terminal resistors with the dynamically controllable resistance are formed above the gate electrode of one or more of the field effect transistor structures.

3. The device of claim 2, wherein the one or more three-terminal resistors each include a source terminal, a drain terminal, and a gate terminal, wherein the gate terminal is the gate electrode of one or more of the field effect transistor structures.

4. The device of claim 1, wherein the one or more three-terminal resistors with a dynamically controllable resistance are thin film transistors.

5. The device of claim 1, wherein the one or more three-terminal resistors with a dynamically controllable resistance are metal-oxide-semiconductor field effect transistors (MOSFETs).

6. A transistor device, comprising:
   one or more gated structures formed in a semiconductor substrate, wherein the one or more gated structures comprise one or more field effect transistor structures each having a gate electrode;
   one or more three-terminal resistors with a dynamically controllable resistance controlled by changes to a gate potential of the one or more gated structures during a switching event, wherein the one or more three-terminal resistors with a dynamically controllable resistance includes polysilicon disposed above the gate electrode of one or more of the field effect transistor structures.

7. The device of claim 6, wherein the polysilicon disposed above the gate electrode is separated from the gate electrode by a dielectric layer.

8. The device of claim 7, wherein each of the one or more gated structure comprises a trench with the gate electrode formed therewithin.

9. The device of claim 8, wherein each of the one or more gated structures further comprises a shield electrode inside the trench below the gate electrode.

10. The device of claim 6, wherein the polysilicon disposed above the gate electrode comprises a source terminal and a drain terminal more heavily doped than a body region between the source terminal and the drain terminal.

11. A transistor device, comprising:
one or more gated structures formed in a semiconductor substrate, wherein the one or more gated structures comprise one or more field effect transistor structures each having a gate electrode;
a snubber circuit connected in parallel with the one or more gated structures, wherein the snubber circuit includes one or more three-terminal resistors with a dynamically controllable resistance controlled by changes to a drain potential of the one or more field effect transistor structures during a switching event.

12. The device of claim 11, wherein the one or more three-terminal resistors with the dynamically controllable resistance are formed in a termination region of the transistor device, wherein the semiconductor substrate in the termination region is maintained at the drain potential of the one or more field effect transistor structures.

13. The device of claim 12, wherein the one or more three-terminal resistors each include a source terminal, a drain terminal, and a gate terminal, wherein the gate terminal is the semiconductor substrate in the termination region that is maintained at the drain potential of the one or more field effect transistor structures.

14. The device of claim 12, wherein the one or more three-terminal resistors with a dynamically controllable resistance are thin film transistor metal-oxide-semiconductor field effect transistors (TFT MOSFETs).

15. A transistor device, comprising:
one or more gated structures formed in a semiconductor substrate, wherein the one or more gated structures comprise one or more field effect transistor structures each having a gate electrode;
one or more three-terminal resistors with a dynamically controllable resistance controlled by changes to a drain potential of the one or more field effect transistor structures during a switching event, wherein the one or more three-terminal resistors with a dynamically controllable resistance includes polysilicon disposed above the semiconductor substrate in a termination region of the transistor device, wherein the semiconductor substrate in the termination region is maintained at the drain potential of the one or more field effect transistor structures.

16. The device of claim 15, wherein the polysilicon is disposed above a body type dopant region on a top portion of the semiconductor substrate in the termination region; wherein the body type dopant region is maintained at the drain potential of the one or more field effect transistor structures.

17. The device of claim 16, wherein the polysilicon disposed above the body type dopant region is separated from the body type dopant region by a dielectric layer.

18. The device of claim 15, wherein the polysilicon disposed above the gate electrode comprises a source terminal and a drain terminal more heavily doped than a body region between the source terminal and the drain terminal.

19. The device of claim 15, wherein the one or more three-terminal resistors with a dynamically controllable resistance are metal-oxide-semiconductor field effect transistors (MOSFETs).

20. The device of claim 15, wherein the one or more three-terminal resistors with a dynamically controllable resistance are junction field effect transistors (JFETs).

* * * * *